United States Patent
Kanno et al.

(10) Patent No.: US 11,880,514 B2
(45) Date of Patent: Jan. 23, 2024

(54) ELECTRONIC PEN AND ELECTRONIC PEN BODY PORTION

(71) Applicant: Wacom Co., Ltd., Saitama (JP)

(72) Inventors: Teppei Kanno, Saitama (JP); Yuta Sato, Saitama (JP)

(73) Assignee: Wacom Co., Ltd., Saitama (JP)

( * ) Notice: Subject to any disclaimer, the term of this patent is extended or adjusted under 35 U.S.C. 154(b) by 0 days.

(21) Appl. No.: 18/075,829

(22) Filed: Dec. 6, 2022

(65) Prior Publication Data
US 2023/0102647 A1    Mar. 30, 2023

Related U.S. Application Data

(63) Continuation of application No. PCT/JP2021/016701, filed on Apr. 27, 2021.

(30) Foreign Application Priority Data

Jun. 12, 2020   (JP) .................................. 2020-102328

(51) Int. Cl.
| | |
|---|---|
| *G06F 3/0354* | (2013.01) |
| *B43K 29/08* | (2006.01) |
| *G06F 3/038* | (2013.01) |
| *H03K 17/96* | (2006.01) |

(52) U.S. Cl.
CPC .......... *G06F 3/03545* (2013.01); *B43K 29/08* (2013.01); *G06F 3/0383* (2013.01); *H03K 17/962* (2013.01)

(58) Field of Classification Search
CPC ... G06F 3/03545; G06F 3/0383; B43K 29/08; H03K 17/962; H03K 17/975
See application file for complete search history.

(56) References Cited

U.S. PATENT DOCUMENTS

| | | | |
|---|---|---|---|
| 10,564,724 B1 * | 2/2020 | Bergeron | G06F 3/0383 |
| 10,817,082 B1 * | 10/2020 | Yildiz | G06F 3/03545 |
| 11,016,585 B2 * | 5/2021 | Park | G06F 3/046 |

(Continued)

FOREIGN PATENT DOCUMENTS

WO    2017/043214 A1    3/2017

OTHER PUBLICATIONS

International Search Report, dated Jun. 8, 2021, for International Application No. PCT/JP2021/016701, 2 pages.

*Primary Examiner* — Dmitriy Bolotin
(74) *Attorney, Agent, or Firm* — Seed IP Law Group LLP

(57) ABSTRACT

Provided is an electronic pen that includes a body portion housing of an electronic pen body portion has housed therein a refill body and a circuit board having a side switch formed by a push button switch mounted thereon, and has a pen-point opening portion through which a pen point of the refill body protrudes. A pressing member is provided in a side opening portion of the body portion housing such that the pressing member is disposed on the side switch in such a manner as to be prevented by an engagement portion from protruding outwardly from a side surface of the body portion housing. The side switch of the circuit board is operated through the pressing member of the electronic pen body portion when an operation unit of the outer housing having the electronic pen body portion installed therein is pressed.

8 Claims, 4 Drawing Sheets

(56) References Cited

U.S. PATENT DOCUMENTS

| | | | |
|---|---|---|---|
| 2011/0164001 A1* | 7/2011 | Seo | G06F 3/038 |
| | | | 345/179 |
| 2014/0354604 A1* | 12/2014 | Huang | G06F 3/03545 |
| | | | 345/179 |
| 2015/0084933 A1* | 3/2015 | Kinoshita | G06F 3/03545 |
| | | | 345/179 |
| 2017/0285775 A1* | 10/2017 | Park | G06F 3/03545 |
| 2018/0364823 A1* | 12/2018 | Kamiyama | G06F 3/0383 |
| 2020/0053196 A1* | 2/2020 | Park | H04M 1/724 |
| 2020/0089340 A1* | 3/2020 | Ruscher | G06F 3/03545 |
| 2020/0089341 A1* | 3/2020 | Wang | H02J 50/00 |
| 2020/0159345 A1* | 5/2020 | Park | G06F 3/046 |
| 2023/0218117 A1* | 7/2023 | Yang | A47J 45/07 |
| | | | 16/425 |

* cited by examiner

ELECTRONIC PEN AND ELECTRONIC PEN BODY PORTION

BACKGROUND

Technical Field

This disclosure relates to an electronic pen and an electronic pen body portion which implement input of information by indicating coordinates for various electronic devices equipped with a position detection sensor, such as a tablet personal computer (PC), a sophisticated telephone terminal, and a pen tablet, for example.

Description of the Related Art

With the advent of various electronic devices equipped with a position detection sensor, electronic pens have come into widespread use. However, there has been a demand for using not an electronic pen dedicated to an electronic device equipped with a position detection sensor but a writing implement, such as a ballpoint pen, which a user is accustomed to using, with a refill that implements electronic pen functions installed in a housing of the writing implement, for example. Accordingly, electronic pens which include a housing of an existing writing implement and a cartridge-type refill (i.e., an electronic pen cartridge) that implements the electronic pen functions and that is installed in the housing have been conceived of.

The electronic pens, which have a function for inputting information to an electronic device, are required to have a capability to be used in a manner similar to that in which what is generally called a mouse, which is a pointing device for a PC, is used. What is generally called the mouse includes click buttons, and various functions can be performed on the PC according to pressing of the click buttons. Thus, a side switch(es) corresponding to the click buttons of what is generally called the mouse is provided on sides of some electronic pens.

However, the electronic pen cartridge is used while being housed in the housing of the writing implement. Accordingly, one possible way is to provide, for example, two contact points on a cartridge housing of the electronic pen cartridge as described in PCT Patent Publication No. WO 2017/043214 such that the two contact points can be connected by operation of an operation portion on the writing implement housing and can thus function as a switch. Alternatively, another possible way is to provide a push button switch on the electronic pen cartridge such that the push button switch can be operated through an operation hole defined in the writing implement housing.

In the case of the related art described in PCT Patent Publication No. WO 2017/043214, the connection between the contact points can be unstable depending on the positional relation between the writing implement housing and the electronic pen cartridge and how the operation portion provided on the writing implement housing is operated. Meanwhile, in the case where the push button switch is provided on the electronic pen cartridge, some problems may occur, and these problems may need to be handled. In the case where the push button switch is provided on the electronic pen cartridge, it may be necessary to define an opening portion for operating the button switch in the cartridge housing, and this leads to a reduction in strength of the electronic pen cartridge. Accordingly, in the case where a high pressure, such as a high pen pressure, is applied to the electronic pen cartridge, it may be necessary to absorb this pressure appropriately to prevent a high load from being applied to the electronic pen cartridge.

In addition, in the case where the push button switch is provided on the electronic pen cartridge, the button switch or an operation portion therefor may protrude from the cartridge housing, and the protruding button switch or operation portion may interfere with installation of the electronic pen cartridge into the writing implement housing. Moreover, it is necessary to define an operation hole for operating the button switch provided on the electronic pen cartridge in the writing implement housing. In this case, the operation hole may cause an uncomfortable feeling to some users, for example, when a finger of the user is caught in the operation hole.

BRIEF SUMMARY

In view of the above circumstances, it is desirable to provide an electronic pen that includes a writing implement housing and an electronic pen cartridge installed therein and that is provided with a side switch capable of being operated properly and securely.

According to an embodiment of this disclosure, there is provided an electronic pen including a tubular outer housing to be grasped by a user and a replaceable cartridge-type electronic pen body portion installed in the outer housing. The electronic pen body portion includes a refill body including a pen point, a circuit board having a push button switch mounted thereon, a tubular body portion housing that houses the refill body and the circuit board, has a pen-point opening portion through which the pen point of the refill body protrudes on a pen-point side of the tubular body portion housing, and has a side opening portion defined in a side of the body portion housing and provided at a position corresponding to a position of the push button switch of the circuit board, and a pressing member that is provided in the side opening portion of the body portion housing, is disposed on the push button switch, and has at least one engagement portion to prevent the pressing member from protruding outwardly from a side surface of the body portion housing. The outer housing includes an opening portion provided on the pen-point side of the tubular body portion housing to enable\ the electronic pen body portion to be installed in the outer housing, an operation-unit opening portion defined in a side of the outer housing and provided at a position corresponding to a position of the pressing member of the electronic pen body portion, when the electronic pen body portion has been installed at a predetermined position, and an operation unit provided in the operation-unit opening portion such that an inside surface of the operation unit which is opposite to the pressing member does not protrude inwardly of an inner wall surface of the outer housing. When the operation unit of the outer housing is pressed, the push button switch of the electronic pen body portion is operated through the pressing member of the electronic pen body portion.

This electronic pen includes the outer housing and the cartridge-type electronic pen body portion installed therein. The electronic pen body portion includes the refill body, the circuit board, the body portion housing, and the pressing member. The body portion housing has housed therein the refill body, which is in the shape of a stick, and the circuit board having the push button switch mounted thereon. The body portion housing has the pen-point opening portion through which the pen point of the refill body protrudes on the pen-point side of the tubular body portion housing, and has the side opening portion defined in the side of the body portion housing and provided at the position corresponding to that of the push button switch of the circuit board. The pressing member is provided in the side opening portion of the body portion housing. The pressing member is disposed on the push button switch in such a manner as to be prevented by the at least one engagement portion from protruding from the side surface of the body portion housing.

The outer housing includes the opening portion provided on the pen-point side of the tubular body portion housing to enable installation of the electronic pen body portion. In addition, the outer housing has the operation unit provided thereon such that the operation unit is positioned on the pressing member of the electronic pen body portion and the inside surface of the operation unit which is opposite to the pressing member does not protrude inwardly of the inner wall surface of the outer housing, when the electronic pen body portion has been installed at the predetermined position. As a result of the operation unit being pressed, the push button switch of the electronic pen body portion is operated through the pressing member of the electronic pen body portion.

DETAILED DESCRIPTION

Figure 1A:
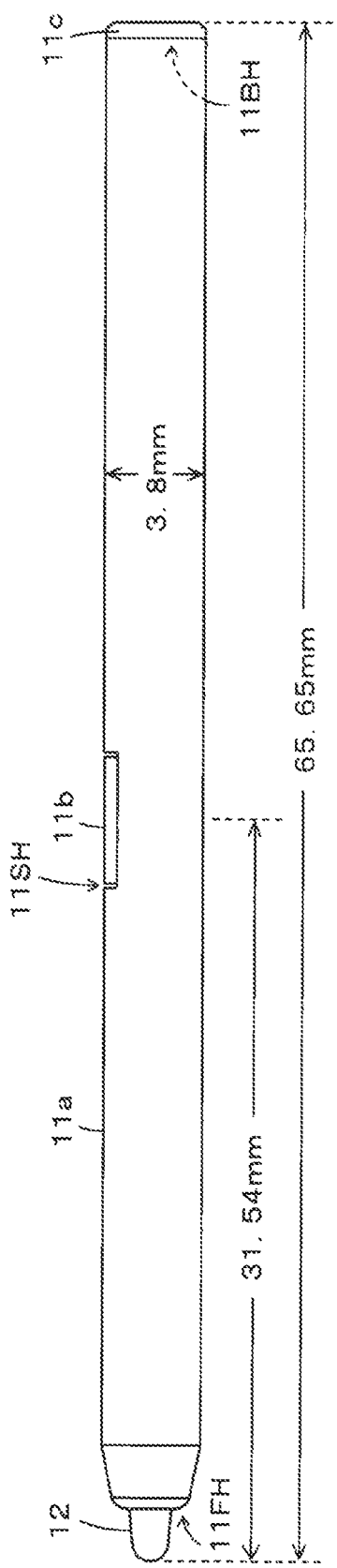
FIGS. 1A and 1B are diagrams for explaining an example structure of an electronic pen body portion according to an embodiment of this disclosure.

Hereinafter, an electronic pen and an electronic pen body portion according to an embodiment of this disclosure will be described with reference to the accompanying drawings. Here, examples of position detection methods employed by electronic pens and position detection sensors include an electromagnetic induction method and a capacitive method. The electromagnetic induction method (or an electro-magnetic resonance (EMR) method) is employed by a position detection device including a sensor portion having a plurality of loop coils arranged in each of an X-axis direction and a Y-axis direction. A transmission period in which power is supplied to the loop coils of the sensor portion sequentially to generate a magnetic field and a reception period in which the supply of power is stopped to enable reception of a magnetic field from the outside are alternately provided. A corresponding electronic pen includes a resonant circuit including a coil and a capacitor, and electric current flows through the coil according to the magnetic field from the sensor portion, generating a signal, which is, with pen pressure information included therein, transmitted to the position detection sensor. In the reception period, the position detection device receives this signal to detect a position indicated by the electronic pen and pen pressure.

The capacitive method is employed by a position detection device including a sensor portion having a plurality of line conductors (i.e., line electrodes) arranged in each of an X-axis direction and a Y-axis direction. The sensor portion detects an indicated position according to changes in capacitance (electric charge) generated in the line conductors due to approach of a finger or a capacitive pen. Here, examples of capacitive pens include a pen-type position indicator having conductivity, and what is generally called an active capacitive pen (of an active electrostatic (AES) type), which is powered by a battery and transmits a signal. In the case of an active capacitive method involving use of an active capacitive pen, the electronic pen transmits a signal from an oscillator circuit installed in the electronic pen with pen pressure information included in the signal, and a position detection device receives the signal to detect an indicated position and pen pressure.

Electronic pens and electronic pen body portions according to embodiments of this disclosure are applicable to both electronic pens that employ the electromagnetic induction method and electronic pens (i.e., active capacitive pens) that employ the active capacitive method. In other words, electronic pens and electronic pen body portions according to embodiments of this disclosure are applicable to various types of electronic pens and electronic pen body portions provided with what is generally called a side switch. The electronic pen and the electronic pen body portion according to the embodiment described below are assumed to employ the electromagnetic induction method for the sake of easier description.

In addition, the electronic pen according to the embodiment described below has substantially the same external size as that of, for example, pencils, ballpoint pens, or the like on the market, and includes an outer housing having a columnar internal cavity and a cartridge-type electronic pen body portion installed in the outer housing. The term "cartridge-type" refers to a freely replaceable part of a device. Accordingly, the cartridge-type electronic pen body portion has an external shape similar to that of, for example, a refill of a ballpoint pen, and corresponds to a refill that implements electronic pen functions. Hereinafter, the cartridge-type electronic pen body portion will be described first, and thereafter, the electronic pen that includes the outer housing with the electronic pen cartridge installed therein will be described.

Example Structure of Electronic Pen Body Portion 1

Figure 1B:
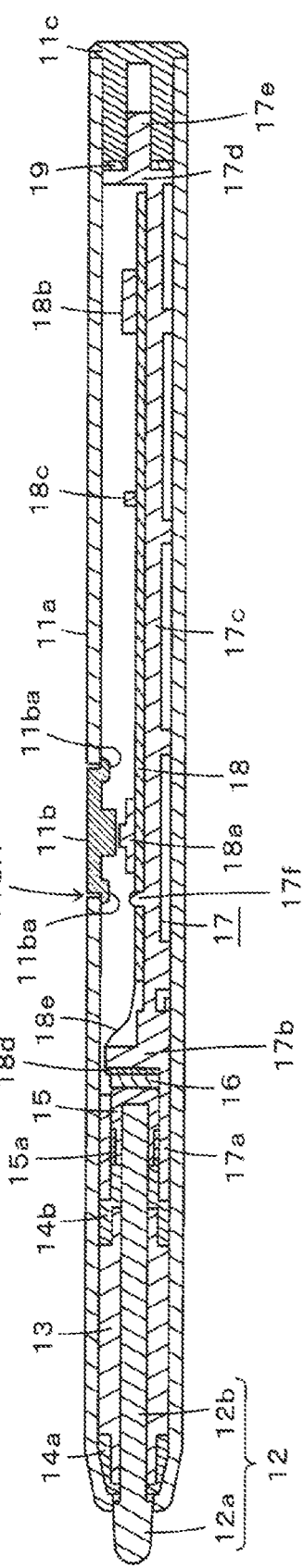
Figure 2A:
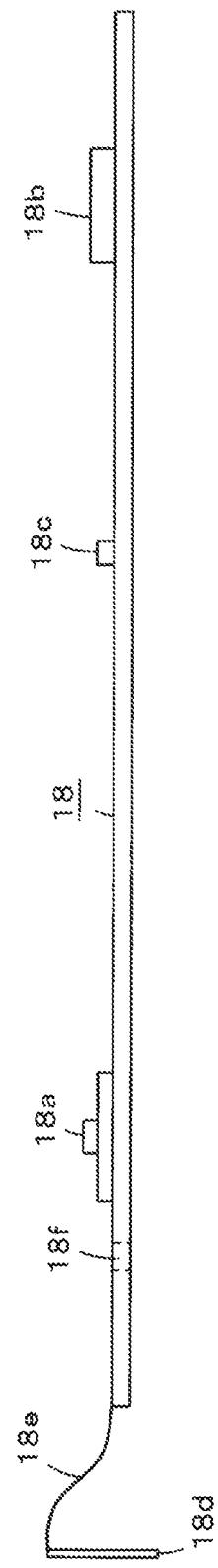
FIGS. 2A and 2B are diagrams for explaining an example structure of a circuit board installed in the electronic pen body portion according to an embodiment of this disclosure.
Figure 2B:
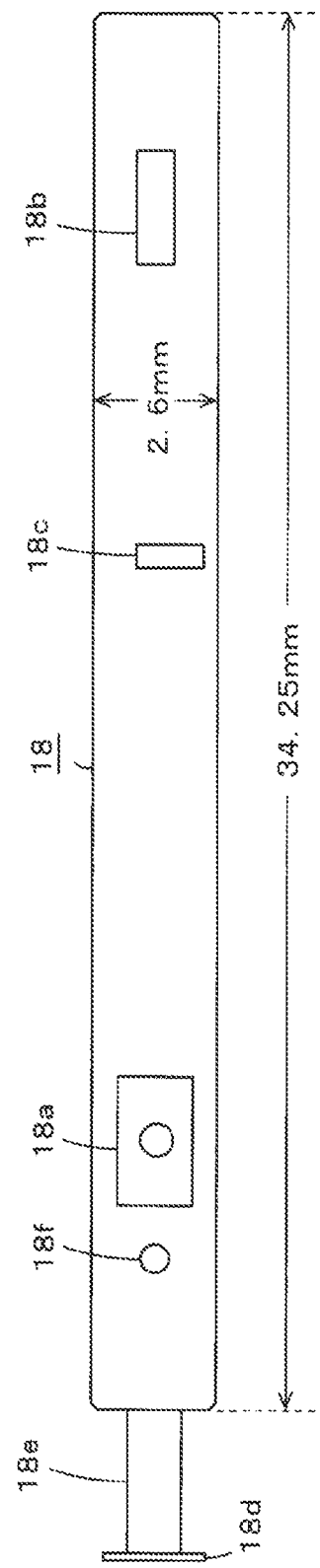

FIGS. 1A and 1B are diagrams for explaining an example structure of an electronic pen body portion 1 according to an embodiment of this disclosure. FIGS. 2A and 2B are diagrams for explaining an example structure of a circuit board 18 installed in the electronic pen body portion 1. FIG. 1A illustrates the external appearance of the electronic pen body portion 1. The electronic pen body portion 1 includes a tubular body portion housing 11a. The body portion housing 11a has a tapered end portion on a pen-point side. The end portion of the body portion housing 11a on the pen-point side has a pen-point opening portion 11FH defined therein, and as illustrated in FIG. 1A, a pen-point portion of a refill body 12, which is fitted in an interior of the body portion housing 11*a*, protrudes from the pen-point opening portion 11FH.

A side of the body portion housing 11*a* has defined therein a side opening portion 11SH provided at a position corresponding to that of a side switch (which is a push button switch) provided on the circuit board installed in the body portion housing 11*a*, and a side switch knob 11*b* as a pressing member is provided in the side opening portion 11SH. The side switch knob 11*b* is a movable portion that acts on the side switch, which will be described later, and functions as a cover portion that closes the side opening portion 11SH. Thus, the side switch knob 11*b* has an additional function of minimizing a reduction in strength of the body portion housing 11*a* by closing (filling in) a portion of the body portion housing 11*a* which causes fragility due to presence of the side opening portion 11SH. In addition, a rear-end opening portion 11BH is defined at a rear end of the body portion housing 11*a* to enable installation of parts including the circuit board, etc., which will be described later. The rear-end opening portion 11BH is closed with a rear cap 11*c*, so that the electronic pen body portion 1 that implements the electronic pen functions is formed.

As illustrated in FIG. 1A, the electronic pen body portion 1 according to this embodiment has a diameter of, for example, 3.8 mm, and a length of, for example, 65.65 mm. Thus, the electronic pen body portion 1 is arranged to have substantially the same size as that of a common refill of a ballpoint pen. In addition, the longitudinal distance from a pen point of the refill body 12 to a middle of the side switch knob 11*b* is arranged to be, for example, 31.54 mm. This makes it possible to provide what is generally called the side switch at such a position in the electronic pen having the electronic pen body portion 1 installed therein that a user grasping the electronic pen can easily operate the side switch with, for example, an index finger of a hand.

FIG. 1B is a sectional view of the electronic pen body portion 1 in the state illustrated in FIG. 1A taken along a plane including a central axis of the electronic pen body portion 1. As illustrated in FIG. 1B, a front core cap 14*a*, a rear core cap 14*b*, and a ferrite core and coil portion 13 held therebetween are provided in the interior of the body portion housing 11*a* on the pen-point side. The ferrite core and coil portion 13 includes a tubular ferrite core having a through hole and a coil formed by a conducting wire wound around a remaining portion of the ferrite core excluding both end portions thereof.

A board holder 17 is provided on the rear side of the rear core cap 14*b*. The board holder 17 includes a tubular end portion 17*a* on the pen-point side, which includes a bottom portion 17*b* having a thickness and a plate-shaped portion 17*c* extending from a rear end surface of the bottom portion 17*b* to the rear-end side. A rear-end bottom portion 17*d* is formed at a rear end of the plate-shaped portion 17*c*, and a fitting projection 17*e* is provided at a center of a rear end surface of the rear-end bottom portion 17*d*. Each of the bottom portion 17*b* and the rear-end bottom portion 17*d* is a portion that is formed in the shape of a circular plate and that has a diameter slightly smaller than the inside diameter of the body portion housing 11*a*.

The front core cap 14*a* is a tubular body that tapers toward the pen point, and the front core cap 14*a* is disposed such that a tapered end portion and a side surface thereof are in contact with an inner wall surface of the body portion housing 11*a*. An end portion of the ferrite core of the ferrite core and coil portion 13 is fitted into the front core cap 14*a* from the rear-end side. The rear core cap 14*b* is a tubular body including two tubular portions having different diameters joined together. The tubular portion of the rear core cap 14*b* which has the smaller diameter is fitted into the tubular end portion 17*a* of the board holder 17 through an opening portion thereof on the pen-point side, while a side surface of the tubular portion of the rear core cap 14*b* which has the greater diameter is in contact with the inner wall surface of the body portion housing 11*a*. In addition, a rear end portion of the ferrite core of the ferrite core and coil portion 13 is fitted into the rear core cap 14*b* from the pen-point side.

A cap-shaped pusher member 15 is provided on the rear side of the rear core cap 14*b*. A rear end portion of the refill body 12 is fitted in the pusher member 15 as described later, so that the pusher member 15 holds the refill body 12 in the body portion housing 11. On the rear-end side of the pusher member 15, a pen pressure detection portion 16 is provided in such a manner as to be held between the pusher member 15 and the bottom portion 17*b* of the tubular end portion 17*a* of the board holder 17. The pen pressure detection portion 16 is arranged to form a micro-electro-mechanical systems (MEMS) sensor. The pen pressure detection portion 16 detects a pen pressure applied to the refill body 12 as, for example, a change in capacitance, as a result of being pressed by the refill body 12 and the pusher member 15. A coil spring 15*a* is provided around a portion of an outer side surface (i.e., an outer wall surface) of the pusher member 15, and when the pen pressure applied to the refill body 12 has been removed, resilience of the coil spring 15*a* causes the refill body 12 to be pressed back to the original position.

In FIG. 1B, the circuit board 18 is mounted and fixed on an upper surface of the board holder 17. As illustrated in a side view of the circuit board 18 in FIG. 2A, various circuit elements, including a side switch 18*a*, a control integrated circuit (IC) 18*b*, and a capacitor 18*c* as main components, are mounted on the circuit board 18 to form a circuit portion. As mentioned above, the side switch 18*a* is formed as a push button switch. As illustrated in FIG. 1B and FIGS. 2A and 2B, an electrode 18*d*, which is connected to the pen pressure detection portion 16, is provided on the pen-point side of the circuit board 18, and the electrode 18*d* and the circuit portion formed on the circuit board 18 are electrically connected to each other through an electrically conductive portion 18*e*.

Further, as illustrated in FIGS. 2A and 2B, the circuit board 18 includes a fixing hole 18*f* passing through the circuit board 18 in a thickness direction at a position in the vicinity of and on the pen-point side of the side switch 18*a*. As illustrated in FIG. 1B, a fixing projection 17*f* provided on the board holder 17 is fitted into the fixing hole 18*f* when the circuit board 18 is mounted at a predetermined position on the board holder 17. The position of the circuit board 18 on the board holder 17 is thus fixed. As illustrated in FIG. 2B, the circuit board 18, excluding the electrode 18*d* and the electrically conductive portion 18*e*, has a length of 34.25 mm and a width of 2.6 mm.

As illustrated in FIG. 1B, in the side of the body portion housing 11*a*, in which the circuit board 18 having the above configuration and the board holder 17 are installed, the side opening portion 11SH is defined at a position that is opposite to the side switch 18*a*, when the circuit board 18 has been set at the predetermined position on the board holder 17. In the side opening portion 11SH, the side switch knob 11*b* is provided on the side switch 18*a* in such a manner as to be pressed by the side switch 18*a* in this embodiment. The side switch knob 11*b* includes engagement portions 11*ba* at opposite ends in a longitudinal direction (i.e., an axial direction) on the side on which the side switch 18*a* lies. Each engagement portion 11*ba* forms a claw portion that projects in the longitudinal direction. The engagement portions 11*ba* are engaged with the inner wall surface of the body portion housing 11*a* to prevent the side switch knob 11*b* from coming off outwardly of the body portion housing 11*a*.

That is, the side switch knob 11*b* is fixed at the side opening portion 11SH between the side switch 18*a* provided on the circuit board 18 and the inner wall surface of the body portion housing 11*a*. In addition, an outer side surface of the side switch knob 11*b* is prevented from protruding from a side surface of the body portion housing 11*a*. As illustrated in FIGS. 1A and 1B, in this embodiment, the outer side surface (i.e., a surface to be operated by the user) of the side switch knob 11*b* is arranged to be flush with the side surface of the body portion housing 11*a*.

A ring-shaped shock absorbing member 19 is provided opposite to the rear end surface of the rear-end bottom portion 17*d* of the board holder 17. As mentioned above, the rear cap 11*c* is fitted into the rear-end opening portion 11BH of the body portion housing 11*a*. The rear cap 11*c* is in the shape of a cup having a columnar recessed portion, and a portion of the rear cap 11*c* which is fitted into the rear-end opening portion 11BH has a diameter slightly greater than the inside diameter of the body portion housing 11*a*, while a bottom of the rear cap 11*c* has a diameter equal to the outside diameter of the body portion housing 11*a*.

Thus, the rear cap 11*c* is fitted into the rear-end opening portion 11BH of the body portion housing 11*a*, and is fitted to the body portion housing 11*a* in such a manner as not to easily be removed therefrom with the fitting projection 17*e* of the board holder 17 fitted into a recessed portion of the rear cap 11*c*. In this case, the fitting projection 17*e* of the board holder 17 is arranged to have a diameter slightly greater than the diameter of the recessed portion of the rear cap 11*c*. In addition, an end surface of the rear cap 11*c* on the pen-point side presses the rear-end bottom portion 17*d* of the board holder 17 to the pen-point side through the shock absorbing member 19.

Thus, as illustrated in FIG. 1B, the front core cap 14*a*, the ferrite core and coil portion 13, the rear core cap 14*b*, the pusher member 15, the pen pressure detection portion 16, the board holder 17, and the circuit board 18 are enclosed in the body portion housing 11*a*. Further, as illustrated in FIG. 1B, the refill body 12 is inserted through the pen-point opening portion 11FH of the body portion housing 11*a*, and is fitted into a recessed portion of the pusher member 15 through the front core cap 14*a*, the ferrite core, and the rear core cap 14*b*.

As illustrated in FIG. 1B, the refill body 12 includes a pen-point portion 12*a* and a shaft portion 12*b*. The shaft portion 12*b* is arranged to have a diameter slightly greater than the inside diameter of a cup portion of the pusher member 15. Thus, as illustrated in FIGS. 1A and 1B, the refill body 12 can be fitted in the interior of the body portion housing 11*a* through the pusher member 15, with the pen-point portion 12*a* of the refill body 12 protruding from the body portion housing 11*a*. In addition, the refill body 12 can be removed out of the body portion housing 11*a* by being pulled off from the pusher member 15. That is, the refill body 12 is detachable from the body portion housing 11*a*. The electronic pen body portion 1 has the structure described above.

Overall Structure of Electronic Pen 3

Figure 3A:
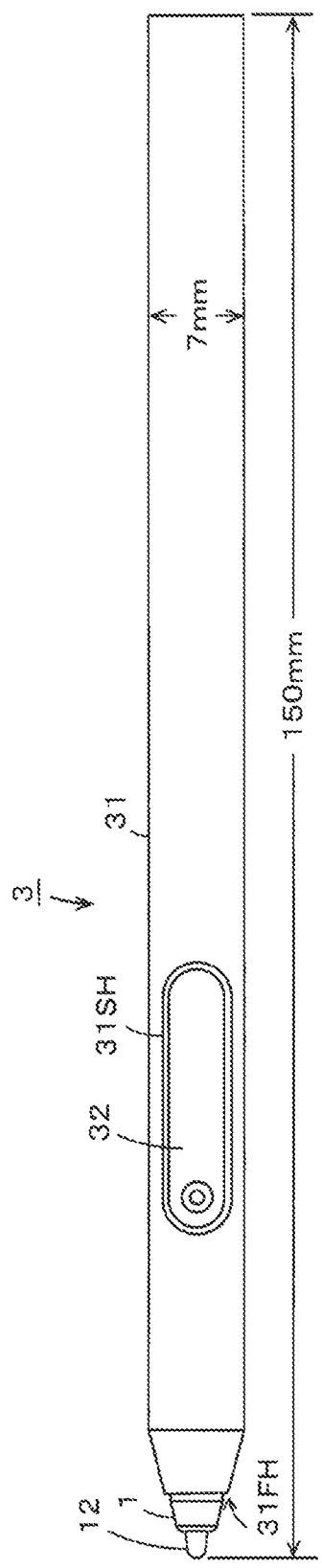
FIGS. 3A and 3B are diagrams for explaining an example structure of an electronic pen having the electronic pen body portion according to an embodiment of this disclosure installed therein.
Figure 3B:
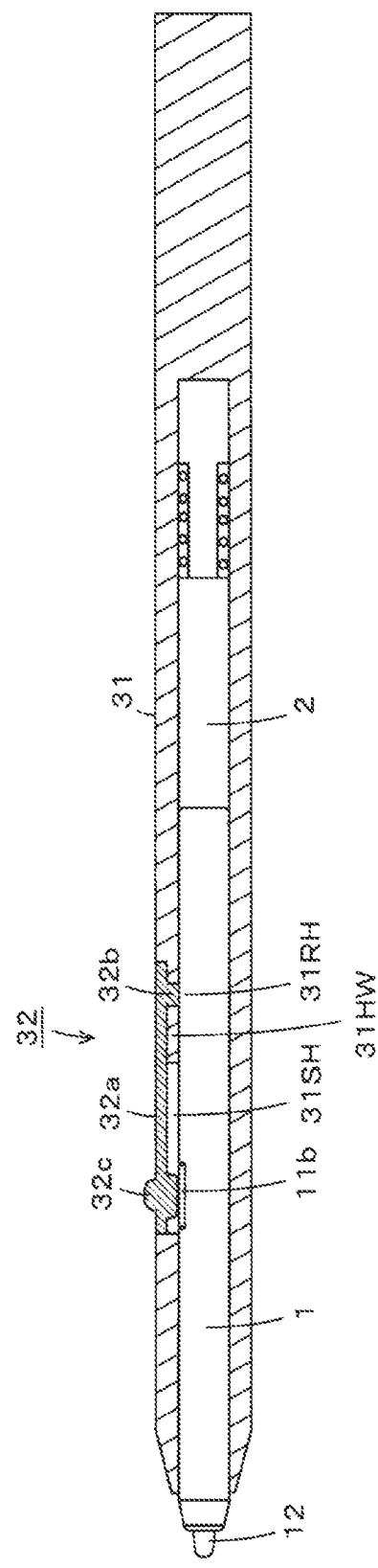

FIGS. 3A and 3B are diagrams for explaining an example structure of an electronic pen 3 having the electronic pen body portion 1 installed therein. FIG. 3A illustrates the external appearance of the electronic pen 3. The electronic pen 3 includes a tubular outer housing 31. The outer housing 31 has a tapered end portion on the pen-point side. The end portion of the outer housing 31 on the pen-point side has an end opening portion 31FH defined therein, and the electronic pen body portion 1, which has been described above with reference to FIGS. 1A and 1B, can be inserted and removed through the end opening portion 31FH. When the electronic pen body portion 1 has been installed in the outer housing 31, the tapered portion of the body portion housing 11*a* of the electronic pen body portion 1 on the pen-point side protrudes as illustrated in FIG. 3A, with the refill body 12 of the electronic pen body portion 1 protruding as well, enabling use of the electronic pen 3 as an electronic pen.

In addition, a side of the outer housing 31 of the electronic pen 3 has defined therein an operation-unit opening portion 31SH, which is elongated in the axial direction, provided at a position corresponding to that of the side switch knob 11*b* provided at the side of the installed electronic pen body portion 1, and an operation unit 32 is fitted in the operation-unit opening portion 31SH. As a result of pressing the operation unit 32, the side switch 18*a*, which is formed by a push button switch, provided on the circuit board 18 of the electronic pen body portion 1 can be pressed through the side switch knob 11*b* of the electronic pen body portion 1. As illustrated in FIG. 3A, the electronic pen 3 has a length of 150 mm from a tip of the refill body 12 to a rear end of the electronic pen 3, and has a diameter of 7 mm. Thus, the length of the electronic pen 3 is shorter than that of pencils according to the JIS standard by approximately 20 mm, but the electronic pen 3 has a size substantially similar to that of pencils according to the JIS standard, and has a size similar to that of common mechanical pencils or ballpoint pens on the market.

FIG. 3B is a sectional view of the electronic pen 3 in the state illustrated in FIG. 3A taken along a plane including a central axis of the electronic pen 3 and passing through a center line of the operation unit 32. Accordingly, not sections but the external appearances of the electronic pen body portion 1 and a shock absorbing mechanism portion 2 installed in the outer housing 31 are illustrated in the figure. As illustrated in FIG. 3B, in an internal hollow portion of the outer housing 31, the electronic pen body portion 1 and the shock absorbing mechanism portion (i.e., a shock absorber) 2 are installed in series in the longitudinal direction. The electronic pen body portion 1 is a portion that implements the electronic pen functions and has the structure described above with reference to FIGS. 1A, 1B, 2A, and 2B. The shock absorbing mechanism portion 2 absorbs and lessens a load applied from the pen-point portion of the electronic pen body portion 1 in the axial direction. Details of the shock absorbing mechanism portion 2 will be described later.

As illustrated in FIG. 3B, in the case of the electronic pen 3 according to this embodiment, a holding wall 31HW having a reduced thickness in a direction perpendicular to the axial direction is provided at a rear end, in the axial direction, of the operation-unit opening portion 31SH defined in the outer housing 31. In addition, the holding wall 31HW has a retaining hole 31RH defined therein. Accordingly, a large through hole of the operation-unit opening portion 31SH is defined on the pen-point side of the holding wall 31HW. As illustrated in FIG. 3A, an upper surface of the operation unit 32 has a shape similar to the shape of the operation-unit opening portion 31SH, and is slightly smaller than the operation-unit opening portion 31SH. As illustrated in FIG. 3A, the operation unit 32 is mounted to the outer housing 31 in such a manner as to close the whole operation-unit opening portion 31SH, including a portion corresponding to the holding wall 31HW.

The operation unit 32, a section of which is illustrated in FIG. 3B, includes a plate-shaped body 32a, a mounting projection 32b, and a pressing portion 32c. As illustrated in FIG. 3B, the combined thickness of the plate-shaped body 32a and the mounting projection 32b of the operation unit 32 is equal to the thickness of the outer housing 31. In addition, the thickness of the mounting projection 32b alone is equal to the thickness of the holding wall 31HW. Hence, the thickness of a portion of the plate-shaped body 32a where the mounting projection 32b is not provided is smaller than the thickness of the outer housing 31, and is substantially equal to a distance from a side surface of the outer housing 31 to an upper surface of the holding wall 31HW as illustrated in FIG. 3B.

As illustrated in FIG. 3B, the operation unit 32 is mounted in the operation-unit opening portion 31SH with the mounting projection 32b on the rear-end side fitted in the retaining hole 31RH of the holding wall 31HW. The mounting projection 32b of the operation unit 32 has the same shape as that of the retaining hole 31RH, and is slightly larger than the retaining hole 31RH. Thus, the operation unit 32 can be securely fixed in the operation-unit opening portion 31SH of the outer housing 31 with the mounting projection 32b securely fitted in the retaining hole 31RH as a result of the mounting projection 32b being forced into the retaining hole 31RH. Here, since the thickness of the mounting projection 32b alone (i.e., the height of the mounting projection 32b) is equal to the thickness of the holding wall 31HW as mentioned above, the mounting projection 32b does not protrude from an inner wall surface of the outer housing 31.

Meanwhile, the pressing portion 32c of the operation unit 32 includes a portion that projects downwardly of the plate-shaped body 32a (i.e., to a side on which the pressing portion 32c faces the side switch knob 11b of the electronic pen body portion 1) and a portion that projects upward (i.e., to a side on which the pressing portion 32c is operated by the user). The portion of the pressing portion 32c which projects downward has a thickness equal to that of the holding wall 31HW, so that the pressing portion 32c does not protrude from the inner wall surface of the outer housing 31. Accordingly, the portion of the pressing portion 32c of the operation unit 32 which projects downward and the abovementioned mounting projection 32b are arranged not to protrude from the inner wall surface of the outer housing 31 when the operation unit 32 is simply mounted to the outer housing 31. Accordingly, neither the portion of the pressing portion 32c which projects downward nor the mounting projection 32b interferes with the installation of the electronic pen body portion 1 into the outer housing 31.

Meanwhile, as illustrated in FIG. 3B, the portion of the pressing portion 32c which projects upward is arranged to slightly project from the side surface of the outer housing 31. This eliminates the need for the user of the electronic pen 3 to visually check the position of the operation unit 32. The user is able to recognize the position of the pressing portion 32c of the operation unit 32 by touching, with a finger, the portion of the pressing portion 32c of the operation unit 32 which projects outward, and properly operate the operation unit 32.

Suppose that the pressing portion 32c of the operation unit 32 has been pressed in the electronic pen 3 described above with reference to FIGS. 3A and 3B. In this case, the side switch 18a on the circuit board installed in the electronic pen body portion 1 can be pressed through the side switch knob 11b of the electronic pen body portion 1 as described above. In addition, when the pressing on the pressing portion 32c of the operation unit 32 is cancelled, resilience of the operation unit 32 causes the operation unit 32 to return to the original position (as illustrated in FIG. 3B). At the same time, resilience of the side switch 18a causes the side switch knob 11b of the electronic pen body portion 1 to be pressed back and returned to the original position. That is, the side switch knob 11b returns to a position at which the side switch knob 11b is located when the side switch 18a has not been pressed (i.e., a position at which the side switch knob 11b is located when a pressing operation has not been performed).

Structure of Shock Absorbing Mechanism Portion (Shock Absorber)

As illustrated in FIG. 3B, in the outer housing 31, the shock absorbing mechanism portion 2 is disposed on the rear-end side of the electronic pen body portion 1. As described above, the shock absorbing mechanism portion 2 absorbs and lessens the load applied from the pen-point portion of the electronic pen body portion 1 in the axial direction. For example, a strong pen pressure may be abruptly applied to the refill body 12 of the electronic pen body portion 1 without the intention of the user of the electronic pen 3, such as when the user has been pushed by a person nearby. Also, the electronic pen 3 on a desk may fall, with the pen point leading, onto a floor or the like, causing a strong shock to be applied to the electronic pen body portion 1 through the refill body 12. In such a case, the shock absorbing mechanism portion 2 causes the electronic pen body portion 1 to be slid to the rear side in the axial direction to absorb the strong external force applied to the electronic pen body portion 1, thereby protecting the electronic pen body portion 1. Needless to say, when the electronic pen 3 is in use, a pressure applied onto an operation surface of an electronic device through the refill body 12 of the electronic pen 3 can be reduced to protect the operation surface of the electronic device.

Figure 4:
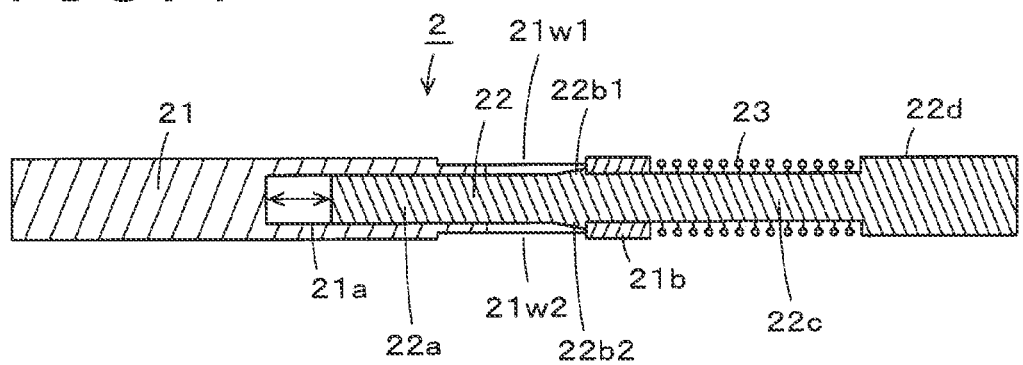
FIG. 4 is a diagram for explaining an example structure of a shock absorbing mechanism portion provided in the electronic pen according to an embodiment of this disclosure.

FIG. 4 is a diagram for explaining an example structure of the shock absorbing mechanism portion 2 provided in the electronic pen 3, and represents a sectional view of the shock absorbing mechanism portion 2 taken along a plane including a central axis of the shock absorbing mechanism portion 2. The shock absorbing mechanism portion 2 includes a cylinder portion 21, a piston portion 22, and a coil spring 23. The cylinder portion 21 has a cylindrical shape as a result of including a hole portion 21a forming an end opening at an end of the cylinder portion 21 on a side (i.e., the right side in FIG. 4) opposite to the pen point. Window portions 21w1 and 21w2, each of which passes through a side of the cylinder portion 21 up to the hole portion 21a, are defined in the side on upper and lower sides in FIG. 4. The window portions 21w1 and 21w2 are defined at positions a predetermined distance away from a rear end surface of the cylinder portion 21 toward the pen-point side (i.e., the left side in FIG. 4). The window portions 21w1 and 21w2 are arranged to allow movement of projection portions 22b1 and 22b2 of the piston portion 22, which will be described below. A tubular engagement portion 21b is formed on the rear-end side of the window portions 21w1 and 21w2.

The piston portion 22 is a member having a columnar shape, and includes a fitting portion 22a, the projection portions 22b1 and 22b2, a spring holding portion 22c, and a rear-end projecting portion 22d arranged in the order named from the pen-point side (i.e., the left side in FIG. 4). Each of the fitting portion 22a and the spring holding portion 22c is a portion having a diameter slightly smaller than the diameter of the hole portion 21a of the cylinder portion 21. The projection portions 22b1 and 22b2, which move in the window portions 21w1 and 21w2 of the cylinder portion 21, are provided at positions between the fitting portion 22a and the spring holding portion 22c that correspond to the positions of the window portions 21w1 and 21w2. Each of the projection portions 22b1 and 22b2 is engaged with an end surface of the engagement portion 21b on the pen-point side, the engagement portion 21b lying at a rear end of the cylinder portion 21. In addition, the rear-end projecting portion 22d is provided on the rear-end side of the spring holding portion 22c. The cylinder portion 21 has a diameter equal to the diameter of the rear-end projecting portion 22d of the piston portion 22.

As illustrated in FIG. 4, the fitting portion 22a of the piston portion 22 is fitted into the hole portion 21a of the cylinder portion 21 having a cylindrical shape. In this case, each of the projection portions 22b1 and 22b2 of the piston portion 22 is positioned in a corresponding one of the window portions 21w1 and 21w2 of the cylinder portion 21. As illustrated in FIG. 4, the spring holding portion 22c is a portion around which the coil spring 23 is provided. The coil spring 23 is held between a rear end surface of the engagement portion 21b of the cylinder portion 21 and a front end surface of the rear-end projecting portion 22d of the piston portion 22. The coil spring 23 acts to make the cylinder portion 21 and the piston portion 22 separate away from each other. However, the projection portions 22b1 and 22b2 of the piston portion 22 are engaged with the engagement portion 21b of the cylinder portion 21 to maintain an initial state illustrated in FIG. 4.

As illustrated in FIG. 3B, the shock absorbing mechanism portion 2 having the above-described structure is fixed in a rear-end portion of the outer housing 31. In this embodiment, an adhesive is applied to a rear-end portion of an inside of the outer housing 31, and the shock absorbing mechanism portion 2 is adhered and fixed to an inner wall surface of the rear-end portion of the outer housing 31. In this embodiment, the coil spring 23 starts to contract (bend) when a load of 450 gf (gram-force) or more has been applied thereto. Accordingly, as illustrated in FIG. 3B, when a load of less than 450 gf is being applied, in the axial direction, to the refill body 12 of the electronic pen body portion 1 on the front side, the coil spring 23 does not contract, keeping the position of the electronic pen body portion 1 unchanged.

However, when a load of 450 gf or more has been applied, in the axial direction, to the refill body 12 of the electronic pen body portion 1, the coil spring 23 contracts, allowing the cylinder portion 21 illustrated in FIG. 4 to move to the rear-end side in such a manner as to reduce a gap indicated by an arrow in FIG. 4. As a result, the electronic pen body portion 1 is slid to the rear-end side in an interior of the outer housing 31, so that the load applied to the refill body 12 of the electronic pen body portion 1 is absorbed. Here, once the load applied to the refill body 12 of the electronic pen body portion 1 is removed, resilience of the coil spring 23 causes the cylinder portion 21 to be pressed back to the pen-point side, accordingly causing the electronic pen body portion 1 to return to the original position. The shock absorbing mechanism portion 2 having the above-described structure acts to reduce an excessive pressure received through the refill body 12 of the electronic pen body portion 1.

Equivalent Circuit of Electronic Pen 3

Figure 5:
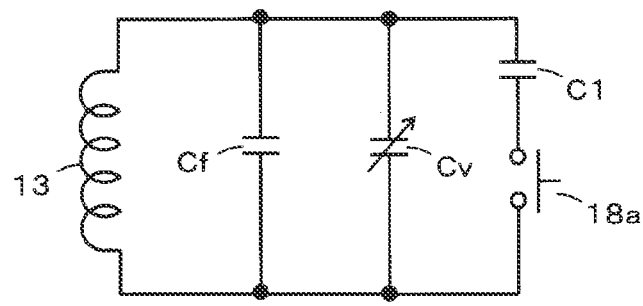
FIG. 5 is a diagram for explaining an equivalent circuit of the electronic pen according to an embodiment of this disclosure.

FIG. 5 is a diagram for explaining an equivalent circuit of the electronic pen 3. Functions of the electronic pen 3 according to this embodiment as an electronic pen are implemented by the electronic pen body portion 1. That is, the electronic pen 3 according to this embodiment has a configuration in which a coil (inductor), a capacitor (condenser) Cf, a variable capacitor Cv, and a combination of a capacitor C1 for frequency change and the side switch 18a are connected in parallel. The coil is the coil of the ferrite core and coil portion 13. The capacitor Cf is, for example, the capacitor 18c provided on the circuit board 18. The variable capacitor Cv corresponds to the pen pressure detection portion 16. Although not illustrated in the figures, the capacitor C1 is mounted on the circuit board 18.

The side switch 18a is formed by the push button switch provided on the circuit board 18. As described above, the side switch 18a can be pressed via the operation unit 32 provided on the outer housing 31, through the side switch knob 11b provided on the body portion housing 11a. When the side switch 18a is not pressed down, the capacitor Cf and the coil of the ferrite core and coil portion 13 together form a resonant circuit, which receives a signal from a position detection sensor that employs the electromagnetic induction method and generates a transmission signal, making it possible to indicate a position through transmission of this signal to the position detection sensor.

In addition, provision of the variable capacitor Cv, which corresponds to the pen pressure detection portion 16, enables the transmission signal that is to be transmitted from the electronic pen 3 to include information indicating the pen pressure as, for example, a change in phase of the transmission signal. Further, the frequency of the transmission signal can be changed by turning on or off of the side switch 18a, which makes the capacitor C1 connected or disconnected. Thus, information as to whether the side switch 18a is on or off can be provided to the position detection sensor that employs the electromagnetic induction method. Such basic functions of the electronic pen are implemented by the electronic pen body portion 1 installed in the electronic pen 3.

Positioning at Time of Installation of Electronic Pen Body Portion 1 into Outer Housing 31

As described above, the side switch 18a of the electronic pen body portion 1 installed in the outer housing 31 is operated through the side switch knob 11b when the operation unit 32 provided on the outer housing 31 is pressed. Hence, it is necessary that the position of the side switch knob 11b of the electronic pen body portion 1 and the position of the operation unit 32 on the outer housing 31 accurately match each other when the electronic pen body portion 1 has been installed in the outer housing 31. Accordingly, the electronic pen 3 according to this embodiment is provided with a configuration for positioning the electronic pen body portion 1 with respect to the outer housing 31.

Figure 6:
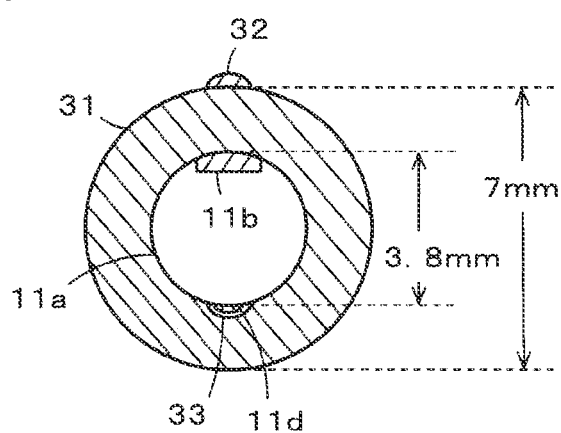
FIG. 6 is a diagram for explaining a configuration for positioning the electronic pen body portion with respect to an outer housing of the electronic pen according to an embodiment of this disclosure.

FIG. 6 is a diagram for explaining the configuration for positioning the electronic pen body portion 1 with respect to the outer housing 31 of the electronic pen 3. Specifically, FIG. 6 is a sectional view of the electronic pen 3 taken along a plane that is perpendicular to the central axis thereof and that passes through the position of the pressing portion 32c of the operation unit 32. Note that the objects, other than the side switch knob 11b, housed in the body portion housing 11a of the electronic pen body portion 1 are not depicted for the sake of easier description.

As illustrated in FIG. 6, in this embodiment, the outer housing 31 has defined in the inner wall surface thereof a groove portion 33 extending from an end portion thereof on the pen-point side to a front end surface of the shock absorbing mechanism portion 2. The groove portion 33 is defined at a position 180 degrees away from a middle of the pressing portion 32c along an outer circumference of the outer housing 31. Meanwhile, the body portion housing 11a has a projection 11d formed on an outer wall surface (i.e., the side surface) thereof, the projection 11d being formed at a position 180 degrees away from the middle of the side switch knob 11b along an outer circumference of the body portion housing 11a. The electronic pen body portion 1 can be installed into the outer housing 31 with the projection 11d formed on the outer wall surface of the body portion housing 11a fitted in the groove portion 33 defined in the inner wall of the outer housing 31, while the positional relation between the outer housing 31 and the body portion housing 11a as illustrated in FIG. 6 is maintained.

In this case, the projection (i.e., a raised portion) 11d formed on the outer wall surface of the body portion housing 11a may be provided only at a rear end portion of the body portion housing 11a, or alternatively, a plurality of projections 11d may be discontinuously provided between the rear end portion of the body portion housing 11a and a position immediately prior to the rear-end side of the tapered portion of the body portion housing 11a on the pen-point side. In addition, the projection 11d formed on the outer wall surface of the body portion housing 11a may be provided linearly (continuously) from the rear end portion of the body portion housing 11a to the position immediately prior to the rear-end side of the tapered portion of the body portion housing 11a on the pen-point side.

Conversely, the outer housing 31 may have a projection (i.e., a raised portion) formed on the inner wall surface thereof, the projection being formed at the position 180 degrees away from the middle of the pressing portion 32c along the outer circumference of the outer housing 31. This projection may be provided only at a front end portion of the outer housing 31, or alternatively, a plurality of projections may be discontinuously provided between a front end of the outer housing 31 and a front end of the shock absorbing mechanism portion 2. Needless to say, the projection may be provided linearly (continuously) from the front end of the outer housing 31 to the front end of the shock absorbing mechanism portion 2. Meanwhile, the body portion housing 11a may have a groove portion defined in the outer wall surface (i.e., the side surface) thereof, the groove portion being defined at the position 180 degrees away from the middle of the side switch knob 11b along the outer circumference of the body portion housing 11a. This groove portion is provided linearly (continuously) from the rear end portion of the body portion housing 11a to the position immediately prior to the rear-end side of the tapered portion of the body portion housing 11a on the pen-point side.

Thus, the electronic pen body portion 1 can be installed into the outer housing 31 with the projection formed on the inner wall of the outer housing 31 fitted in the groove portion defined in the outer wall of the body portion housing 11a, while the positional relation between the outer housing 31 and the body portion housing 11a as illustrated in FIG. 6 is maintained. As described above, the inner wall surface of the outer housing 31 has defined therein, at least at one position, a groove portion extending in the axial direction from a front end surface of the outer housing 31, while the outer wall surface of the body portion housing 11a has provided thereon, at least on the rear end portion thereof, a raised portion to be fitted in the groove portion of the outer housing 31. Alternatively, the inner wall surface of the outer housing 31 may have a raised portion formed thereon at least at one position at least on the front end portion thereof, while the outer wall surface of the body portion housing 11a may have defined therein a groove portion to be fitted to the raised portion of the outer housing 31, the groove portion extending in the axial direction from a rear end surface of the body portion housing 11a.

Thus, the fitting of the two portions to each other enables proper positioning of the electronic pen body portion 1 with respect to the outer housing 31. This enables the electronic pen body portion 1 to be installed in the outer housing 31 in such a manner as to ensure that the position of the side switch knob 11b of the electronic pen body portion 1 and the position of the operation unit 32 mounted to the outer housing 31 match each other.

Note that, although the case where the groove portion and the projection (i.e., the raised portion) paired with each other are provided at one position has been described above, this is not essential to this disclosure. Needless to say, groove portions and projections (i.e., raised portions) paired with each other may be provided at a plurality of positions. For example, the inner wall of the outer housing 31 and the outer wall of the body portion housing 11a may have groove portions and projections provided at positions opposite to each other across the central axis of the electronic pen 3. In this case, at one of the positions, the inner wall of the outer housing 31 and the outer wall of the body portion housing 11a may have a groove portion and a raised portion, respectively, while at the other positions, the inner wall of the outer housing 31 and the outer wall of the body portion housing 11a may have a raised portion and a groove portion, respectively, for example.

Effects of Embodiment

The electronic pen 3 according to the above-described embodiment can be realized by simply installing the electronic pen body portion 1 and the shock absorbing mechanism portion 2 in the outer housing 31. The electronic pen body portion 1 has substantially the same size as that of a common refill of a ballpoint pen, and the circuit board installed in the body portion housing 11a thereof is provided with the side switch 18a. The side opening portion 11SH for enabling the pressing of the side switch 18a is defined in the body portion housing 11a, but the side opening portion 11SH is closed with the side switch knob 11b, which is capable of being pressed, provided therein. A portion of the body portion housing 11a which is made fragile by the side opening portion 11SH is accordingly reinforced. Moreover, the upper surface of the side switch knob 11b, which is arranged not to protrude from the side surface of the body portion housing 11a, does not interfere with the installation or removal of the electronic pen body portion 1 into or from the outer housing 31.

Further, the outer housing 31 is provided with the operation unit 32, which is disposed at a position corresponding to that of the side switch knob 11b provided on the body portion housing 11a of the installed electronic pen body portion 1. As a result of pressing the operation unit 32, the side switch 18a on the circuit board 18 can be properly operated through the side switch knob 11b provided on the body portion housing 11a of the electronic pen body portion 1. Moreover, since the operation unit 32 provided on the outer housing 31 does not protrude from the inner wall surface of the outer housing 31, the operation unit 32 does not interfere with the installation of the electronic pen body portion 1 or the shock absorbing mechanism portion 2.

Further, in the outer housing 31, the shock absorbing mechanism portion 2 is installed on the rear-end side, and the electronic pen body portion 1 is installed on the front side of the shock absorbing mechanism portion 2. Thus, even when an excessive pressure has been applied to the refill body 12 of the electronic pen body portion 1, this pressure can be absorbed by the shock absorbing mechanism portion 2 to protect the electronic pen body portion 1. In this case, when the electronic pen 3 is in use, being placed on an operation surface of a position detection sensor, an application of an excessive load from the refill body 12 of the electronic pen body portion 1 to the operation surface can be prevented to protect the operation surface. Furthermore, the groove portion and the raised portion, or the raised portion and the groove portion, are provided at corresponding positions in the outer housing 31 and the body portion housing 11a, respectively, and this enables the electronic pen body portion 1 to be securely installed at a proper position in the outer housing 31. This contributes to preventing positional misalignment between the side switch knob 11b on the body portion housing 11a and the operation unit 32 on the outer housing 31.

Example Modifications

Although each of the outer housing 31 and the body portion housing 11a according to the above-described embodiment has a cylindrical shape, this is not essential to this disclosure. For example, the outer housing 31 may alternatively be arranged to have a hexagonal side surface like that of a common pencil, with a columnar hole portion defined inside. Also, the outer housing 31 may alternatively be arranged to have an internal hole portion in the shape of a prism with a polygonal section, and the body portion housing 11a may accordingly be arranged to have a matching shape. In this case, a mechanism (i.e., a raised portion and a groove portion) for the alignment at the time of the installation may not be formed.

Note that the shapes of the outer housing 31 and the body portion housing 11a are not limited to the abovementioned examples, and may be any of various other desirable shapes. An important point in this case is that the side switch knob 11b of the electronic pen body portion 1 and the operation unit 32 on the outer housing 31 are properly aligned with each other.

In addition, in the above-described embodiment, as illustrated in FIGS. 1A and 1B, the outer side surface (i.e., the surface to be operated by the user) of the side switch knob 11b is arranged to be flush with the side surface of the body portion housing 11a. Note, however, that this is not essential to this disclosure. It may be sufficient if the outer side surface (i.e., the surface to be operated by the user) of the side switch knob 11b does not protrude outward from the side surface of the body portion housing 11a so as not to interfere with the installation of the electronic pen body portion 1 into the outer housing 31.

In addition, it may be sufficient if each of the mounting projection 32b of the operation unit 32 and the portion of the pressing portion 32c which projects downward is arranged not to protrude inwardly of the inner wall surface of the outer housing 31. Accordingly, needless to say, each of the mounting projection 32b of the operation unit 32 and the portion of the pressing portion 32c which projects downward may be slightly recessed from the inner wall surface of the outer housing 31 when the operation unit 32 is mounted to the outer housing 31. Even in this case, it is sufficient if the operation unit 32 is securely mounted to the outer housing 31 and the side switch 18a can be properly pressed through the side switch knob 11b when the pressing portion 32c has been pressed.

In addition, each of the body portion housing 11a, the board holder 17, the rear cap 11c, the refill body 12, the outer housing 31, the cylinder portion 21, the piston portion 22, and so on can be made of a polyoxymethylene or polyacetal (POM) resin, an acrylonitrile butadiene styrene (ABS) resin, or the like. Meanwhile, the shock absorbing member 19, which is disposed at a rear end of the rear-end bottom portion 17d of the board holder 17 of the electronic pen body portion 1, is made of elastomer. The abovementioned materials are mere examples, and any of various other desirable materials may alternatively be adopted as long as the parts can similarly be formed to maintain similar strengths.

In addition, the circuit board 18 is formed as a flexible printed circuit (FPC) board. Note, however, that this is not essential to this disclosure, and that the circuit board 18 may alternatively be formed as a rigid circuit board formed using an inflexible insulator base, or a rigid flexible circuit board formed by a combination of a hard material and a thin flexible material.

Also note that, although one side switch (i.e., the push button switch) 18a is provided on the circuit board 18 in the above-described embodiment, this is not essential to this disclosure. For example, two side switches may alternatively be provided on the circuit board 8, at different positions in the longitudinal direction, and a side switch knob(s) that acts for the two side switches separately may be provided. A seesaw-type operation unit, for example, may accordingly be provided on the outer housing 31 to make it possible to separately operate the two side switches provided at different positions in the longitudinal direction.

Also note that, although the above-described embodiment has been described with reference to an example case where the side switch is provided on the electronic pen that employs the electromagnetic induction method, this is not essential to this disclosure. Embodiments of this disclosure are applicable to, for example, electronic pens that employ the active capacitive method as well. An electronic pen that employs the active capacitive method according to an embodiment of this disclosure may have a three-layer structure, being provided with a side switch, a corresponding side switch knob provided on a body portion housing, and a corresponding operation unit provided on an outer housing. This electronic pen that employs the active capacitive method thus allows the side switch, contained in an electronic pen body portion, to be operated from the side on which the outer housing lies. Also in the case of the electronic pen that employs the active capacitive method, a shock absorbing mechanism portion may be provided on the rear side of the electronic pen body portion to protect the electronic pen body portion.

It is to be noted that the embodiment of the present disclosure is not limited to the foregoing embodiment, and that various changes can be made without departing from the spirit of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic pen comprising:
  a tubular outer housing to be grasped by a user; and
  a replaceable cartridge-type electronic pen body portion installed in the outer housing, wherein:
  the electronic pen body portion includes:
    a refill body including a pen point,
    a circuit board having a push button switch mounted thereon,
    a tubular body portion housing that houses the refill body and the circuit board, has a pen-point opening portion through which the pen point of the refill body protrudes on a pen-point side of the tubular body portion housing, and has a side opening portion defined in a side of the body portion housing and provided at a position corresponding to a position of the push button switch of the circuit board, and
    a pressing member that is provided in the side opening portion of the body portion housing, is disposed on the push button switch, and has at least one engagement portion that prevents the pressing member from protruding outwardly from a side surface of the body portion housing,
  the outer housing includes:
    an opening portion provided on the pen-point side of the tubular body portion housing that enables the electronic pen body portion to be installed in the outer housing,
    an operation-unit opening portion defined in a side of the outer housing and provided at a position corresponding to a position of the pressing member of the electronic pen body portion when the electronic pen body portion has been installed at a predetermined position, and
    an operation unit provided in the operation-unit opening portion such that an inside surface of the operation unit that is opposite to the pressing member does not protrude inwardly from an inner wall surface of the outer housing, and
  when the operation unit of the outer housing is pressed, the push button switch of the electronic pen body portion is operated through the pressing member of the electronic pen body portion.

2. The electronic pen according to claim 1, wherein the at least one engagement portion of the pressing member of the electronic pen body portion includes claw portions provided at opposite ends of the pressing member in a longitudinal direction of the pressing member.

3. The electronic pen according to claim 1, wherein:
  the pressing member of the electronic pen body portion has an outside surface flush with the side surface of the body portion housing, and
  the inside surface of the operation unit of the outer housing that is opposite to the pressing member is flush with the inner wall surface of the outer housing.

4. The electronic pen according to claim 1, wherein the outer housing has a shock absorbing mechanism portion installed therein, the shock absorbing mechanism portion being disposed on a rear-end side of the electronic pen body portion installed in the outer housing and in contact with a rear end surface of the electronic pen body portion.

5. The electronic pen according to claim 4, wherein:
  the shock absorbing mechanism portion is a unitary portion including a cylinder portion, a piston portion, and an elastic member that acts on the cylinder portion and the piston portion, and
  when a pressure having a predetermined value or more has been applied to the refill body of the electronic pen body portion installed in the outer housing, the elastic member contracts to cause the piston portion to move deeper into the cylinder portion, causing the electronic pen body portion to slide inside the outer housing.

6. The electronic pen according to claim 1, wherein:
  the inner wall surface of the outer housing has defined therein, at least at one position, a groove portion extending in an axial direction of the outer housing from a front end surface of the outer housing, and
  an outer wall surface of the body portion housing has provided thereon, at least on a rear end portion thereof, a raised portion fitted in the groove portion of the outer housing.

7. The electronic pen according to claim 1, wherein:
  the inner wall surface of the outer housing has a raised portion formed thereon at least at one position at least on a front end portion thereof, and
  an outer wall surface of the body portion housing has defined therein a groove portion fitted to the raised portion of the outer housing, the groove portion extending in an axial direction of the body portion housing from a rear end surface of the body portion housing.

8. An electronic pen body portion for use in an electronic pen including a tubular outer housing to be grasped by a user and a replaceable cartridge-type electronic pen body portion installed in the outer housing,
  the outer housing including an opening portion provided on a pen-point side of the outer housing to enable installation of the electronic pen body portion, an operation-unit opening portion defined in a side of the outer housing and provided at a position corresponding to a position of a pressing member of the electronic pen body portion when the electronic pen body portion has been installed at a predetermined position, and an operation unit provided in the operation-unit opening portion such that an inside surface of the operation unit which is opposite to the pressing member does not protrude inwardly from an inner wall surface of the outer housing,
  the electronic pen body portion comprising:
    a refill body including a pen point;
    a circuit board having a push button switch mounted thereon;
    a tubular body portion housing that houses the refill body and the circuit board, has a pen-point opening portion through which the pen point of the refill body protrudes on the pen-point side of the tubular body portion housing, and has a side opening portion defined in a side of the body portion housing and provided at a position corresponding to a position of the push button switch of the circuit board; and
    a pressing member that is provided in the side opening portion of the body portion housing, is disposed on the push button switch, and has an engagement portion that prevents the pressing member from protruding outwardly of a side surface of the body portion housing, wherein, when the electronic pen body portion has been installed in the outer housing, the push button switch is operated through the pressing member as a result of the operation unit of the outer housing being pressed.

\* \* \* \* \*